(12) United States Patent
Tsai et al.

(10) Patent No.: US 11,942,418 B2
(45) Date of Patent: Mar. 26, 2024

(54) SEMICONDUCTOR STRUCTURE AND METHOD FOR MAKING THE SAME

(71) Applicant: TAIWAN SEMICONDUCTOR MANUFACTURING COMPANY, LTD., Hsinchu (TW)

(72) Inventors: Po-Chuan Tsai, Hsinchu (TW); Wei-Ken Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 33 days.

(21) Appl. No.: 17/383,690

(22) Filed: Jul. 23, 2021

(65) Prior Publication Data

US 2023/0026034 A1    Jan. 26, 2023

(51) Int. Cl.
  *H01L 23/522* (2006.01)
  *H01L 21/768* (2006.01)
  *H01L 23/00* (2006.01)
  *H01L 23/528* (2006.01)

(52) U.S. Cl.
  CPC ........ *H01L 23/5226* (2013.01); *H01L 21/768* (2013.01); *H01L 23/528* (2013.01); *H01L 24/14* (2013.01)

(58) Field of Classification Search
  CPC . H01L 23/5226; H01L 21/768; H01L 23/528; H01L 27/0207; H01L 24/14; H01L 23/53295; H01L 24/13
  See application file for complete search history.

(56) References Cited

U.S. PATENT DOCUMENTS

| | | | | |
|---|---|---|---|---|
| 2001/0003381 | A1* | 6/2001 | Orlowski | H01L 21/3105 257/E21.268 |
| 2002/0080551 | A1* | 6/2002 | Kitagawa | H01G 4/20 361/302 |
| 2013/0087908 | A1* | 4/2013 | Yu | H01L 24/13 257/737 |
| 2017/0077286 | A1* | 3/2017 | Lo | H01L 29/1054 |
| 2018/0034056 | A1* | 2/2018 | Cho | H01M 4/1395 |
| 2020/0152608 | A1* | 5/2020 | Hu | H01L 23/5389 |
| 2021/0098399 | A1* | 4/2021 | Huang | H01L 24/03 |
| 2021/0098405 | A1* | 4/2021 | Chu | H01L 21/76834 |
| 2021/0198470 | A1* | 7/2021 | Wu | B32B 27/306 |

FOREIGN PATENT DOCUMENTS

JP         2016076712     *   8/2016    ............ H01L 21/00

* cited by examiner

*Primary Examiner* — Galina G Yushina
(74) *Attorney, Agent, or Firm* — Birch, Stewart, Kolasch & Birch, LLP (57) ABSTRACT

A semiconductor structure includes a combined feature, a protection layer and a polymeric layer. The combined feature includes a passivation layer, an interconnecting structure disposed on the passivation layer, and a dielectric layer disposed on the passivation layer and the interconnecting structure. The protection layer is disposed on the dielectric layer, and is oxide-and-nitride based. The polymeric layer is disposed on the protection layer, and is separated from the interconnecting structure by the protection layer. A method of making a semiconductor structure is also provided.

20 Claims, 11 Drawing Sheets

SEMICONDUCTOR STRUCTURE AND METHOD FOR MAKING THE SAME

BACKGROUND

As the dimensions of semiconductor devices, especially the dimensions associated with front-end-of-line (FEOL) processes and the middle-end-of-line (MEOL) processes, decrease and approach physical limitation, manufacturers of the semiconductor devices begin to place greater emphasis on developing more compact and reliably packaged structures of the semiconductor devices.

The semiconductor devices (e.g., integrated circuits, etc.) are formed on a semiconductor substrate (e.g., a wafer). Each of the semiconductor devices is connected to an interconnecting structure (e.g., an aluminum pad), which is then connected to a redistribution layer (RDL), a bump feature or other suitable structures. A polymeric layer is often formed on and in contact with the interconnecting structure. It is desirable to minimize the influence of some compositions of the polymeric layer on the interconnecting structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
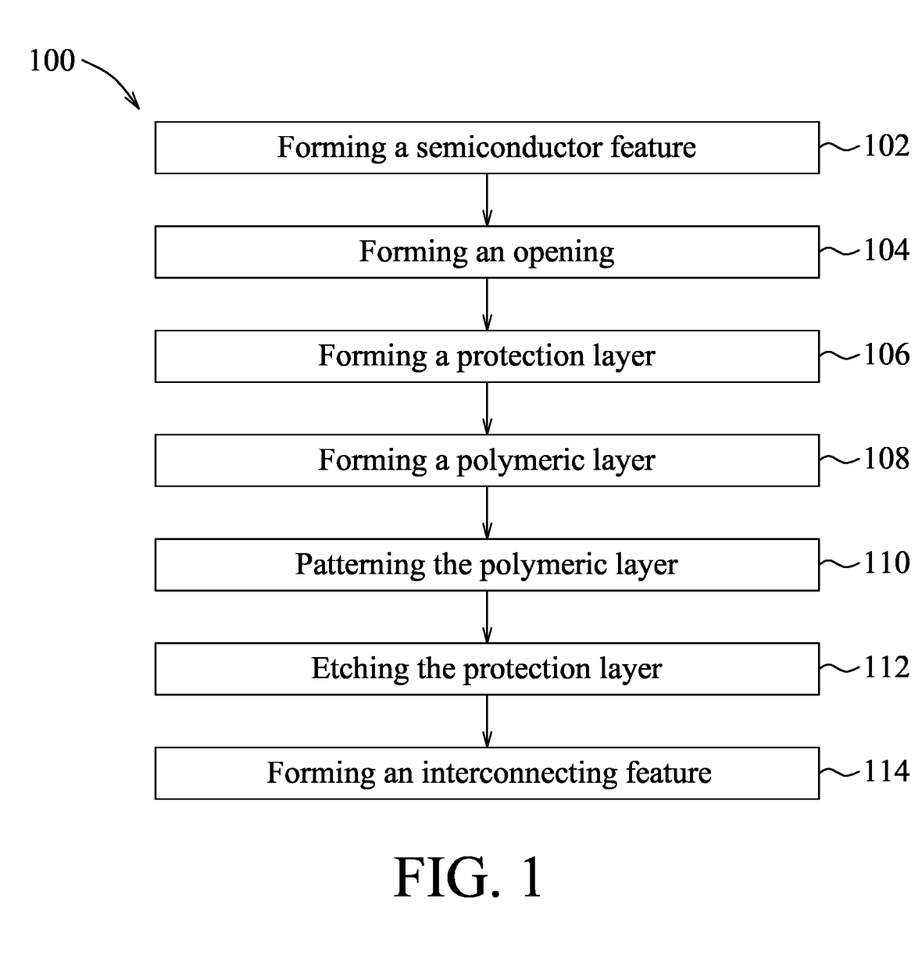
FIG. 1 is a flow diagram of a method of making a semiconductor structure in accordance with some embodiments.

FIG. 1 illustrates a method 100 for making a semiconductor structure 200 (see FIG. 6) in accordance with some embodiments. FIGS. 2 to 5 are schematic views showing intermediate stages of the method 100 as depicted in FIG. 1. Additional steps which are not limited to those described in the method 100, can be provided before, during or after manufacturing the semiconductor structure 200, and some of the steps described herein may be replaced by other steps or be eliminated. Similarly, additional features may be present in the semiconductor structure 200, and/or the features present may be replaced or eliminated in additional embodiments.

Figure 2:
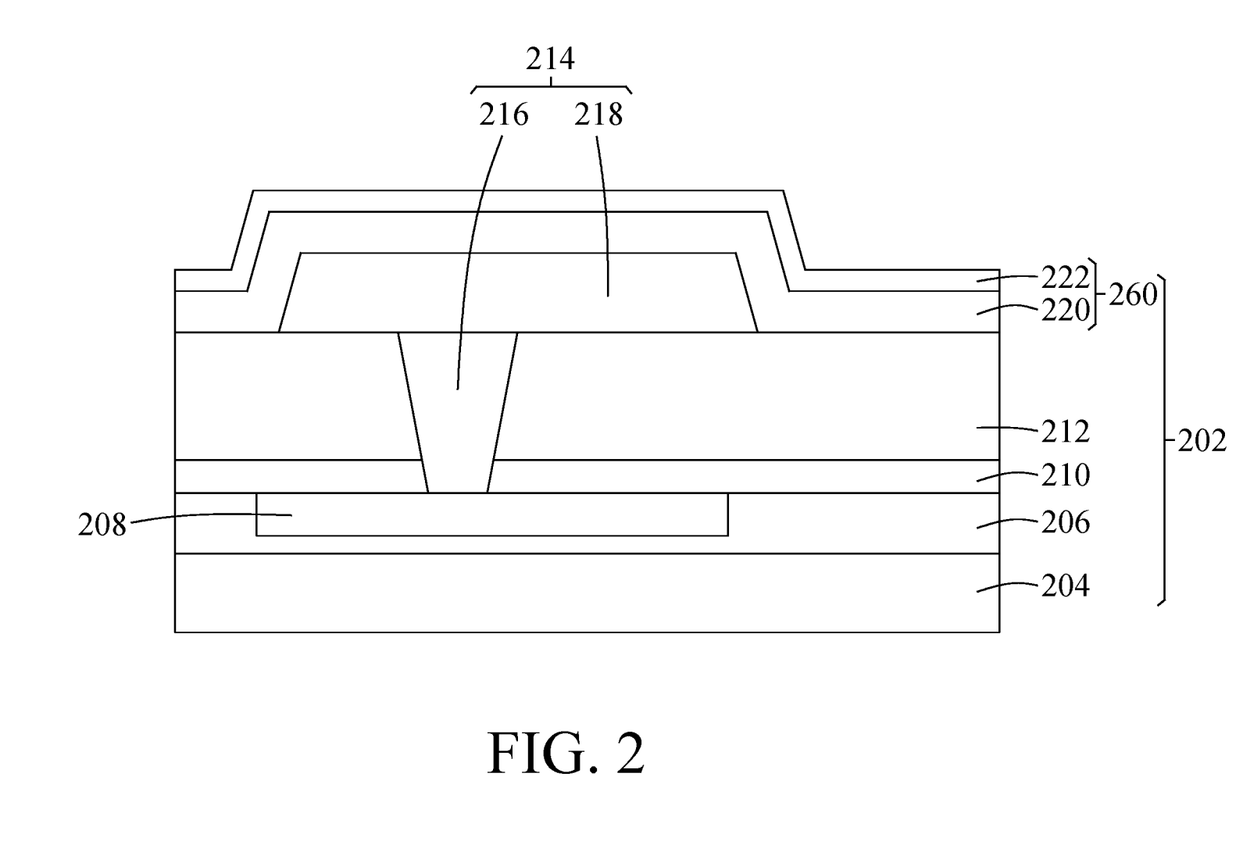
FIGS. 2 to 6 are schematic views showing intermediate stages of the method for making the semiconductor structure in accordance with some embodiments.

Referring to FIG. 1, the method 100 begins at block 102, where a combined feature is formed. Referring to FIG. 2, the combined feature 202 includes a substrate 204. In some embodiments, the substrate 204 may be made of an elemental semiconductor, a compound semiconductor, other suitable materials, or any combination thereof. The elemental semiconductor may contain a single species of atoms, such as Si, Ge or other suitable materials, e.g., other elements from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or the like. In some embodiments, the composition of the compound semiconductor including the aforesaid elements may change from one ratio at one location to another ratio at another location (i.e., the compound semiconductor may be of a gradient composition). In some embodiments, the substrate 204 may be a semiconductor-on-insulator (SOI) substrate, such as silicon germanium-on-insulator (SGOI) substrate, or the like. In some embodiments, the substrate 204 may include a non-semiconductor material, such as glass, quartz (e.g., fused quartz), calcium fluoride ($CaF_2$), other suitable materials, or any combination thereof. In some embodiments, the substrate 204 may include a plurality of active elements (not shown), such as transistors. Each of the transistors may be a planar transistor, a three dimensional transistor, or other suitable devices.

In accordance with some embodiments, the combined feature 202 further includes an interconnecting feature 206 disposed on the substrate 204. The interconnecting feature 206 may include multiple interlayer dielectric (ILD) layers (not shown), and multiple conductive components (not shown), such as contacts, metal lines, vias, etc., which are electrically connected to the active elements in the substrate 204. In some embodiments, the ILD layers may be made of a low-K dielectric material or other suitable materials. In some embodiments, the ILD layers may include undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH, SiOCN, etc.), silicon carbon nitride (SiCN), other suitable materials, or any combination thereof. In some embodiments, the interconnecting feature 206 includes a top metal layer 208 (may also be referred to as Mz metal, etc.), which is the topmost metal layer in the interconnecting feature 206. In some embodiments, the top metal layer 208 may be made of copper, aluminum, other suitable materials or any combination thereof.

In accordance with some embodiments, the combined feature 202 further includes an etch stop layer (ESL) 210 disposed on the interconnecting feature 206 and a passivation layer 212 (also known as passivation-1 or pass-1) disposed on the etch stop layer 210. In some embodiments, the etch stop layer 210 may include silicon nitride (SiN), silicon carbide (SiC), silicon carbon nitride (SiCN), silicon oxycarbide (SiOCN), other suitable materials, or any combination thereof. In some embodiments, the passivation layer 212 may include undoped silica glass (USG), other suitable materials, or any combination thereof.

In accordance with some embodiments, the combined feature 202 further includes an interconnecting structure 214, which includes a contact via 216 that penetrates the passivation layer 212 and the etch stop layer 210 and that is electrically connected to the top metal layer 208, and a metal pad 218 that is disposed on the passivation layer 212 and that is electrically connected to the contact via 216. In some embodiments, the interconnecting structure 214 may be made of aluminum, other suitable materials, or any combination thereof.

In accordance with some embodiments, the combined feature 202 further includes a first dielectric layer 220 that is disposed on and covers the passivation layer 212 and the interconnecting structure 214, and a second dielectric layer 222 that is disposed on the first dielectric layer 220. In some embodiments, the first and second dielectric layers 220, 222 may be collectively referred to as a dielectric layer 260. In some embodiments, the first dielectric layer 220 may include a bottom sub-layer that may be made of USG and a top sub-layer that may be made of a suitable oxide material formed by high-density plasma chemical vapor deposition (HDP CVD). In some embodiments, the second dielectric layer 222 may be made of silicon nitride and may be formed by CVD. The thickness of the first dielectric layer 220 may be determined according to practical requirements, and the thickness of the second dielectric layer 222 may range from about 100 Å to about 1000 Å, but other range values are also within the scope of this disclosure. In some embodiments, the second dielectric layer 222 may be used for protecting underlying elements from various contaminants, such as ambient moisture. If the thickness of the second dielectric layer 222 is too small, such as smaller than about 100 Å, the second dielectric layer 222 may not effectively protect the underlying elements. If the thickness of the second dielectric layer 222 is too large, such as greater than about 1000 Å, such thick second dielectric layer 222 may bring undesirable stress to the combined feature 202.

Figure 3:
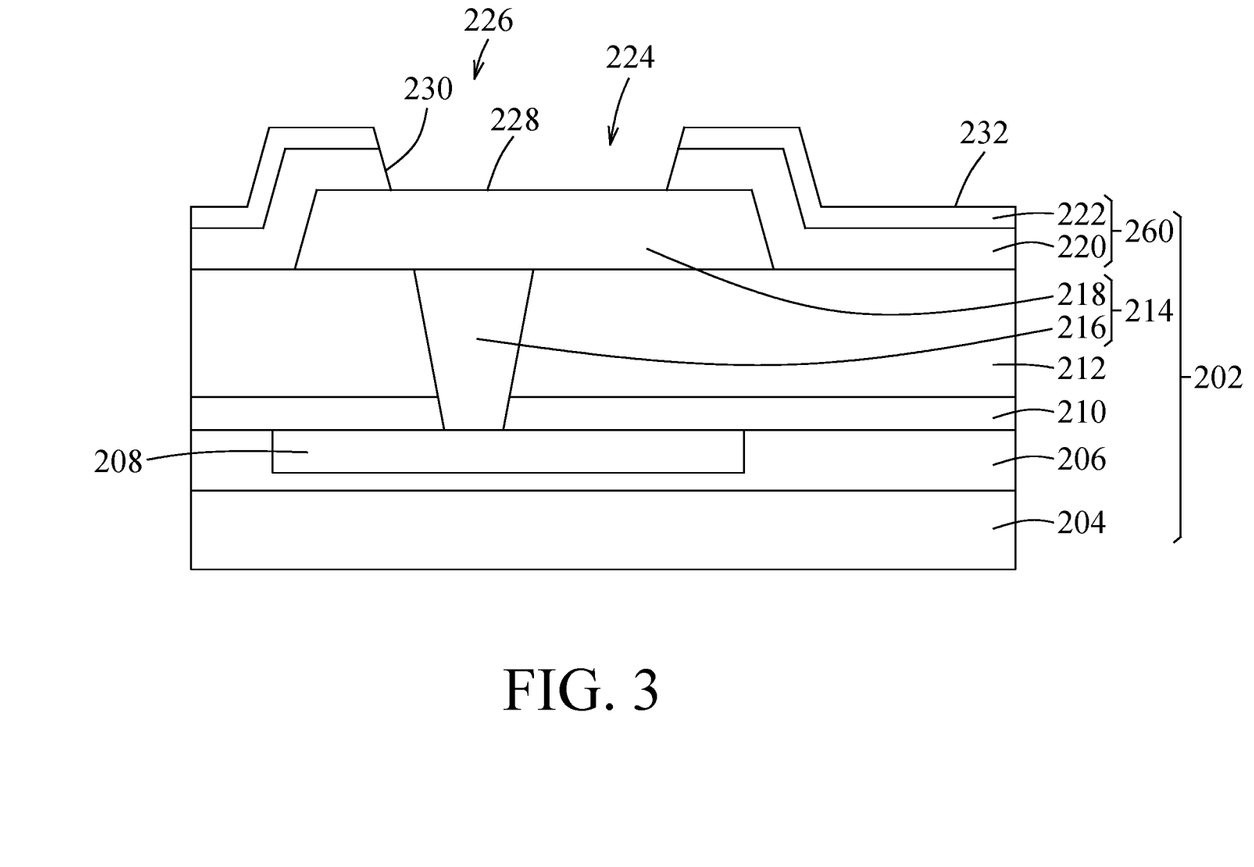

In accordance with some embodiments, as shown in FIG. 1, the method 100 then proceeds to block 104, where an opening is formed. Referring to FIG. 3, in some embodiments, the opening 224 may be formed in the first dielectric layer 220 and the second dielectric layer 222 using a suitable etching technique, such as plasma dry etch, wet etch, other suitable techniques or any combination thereof, to expose a surface 228 of the metal pad 218 of the interconnecting structure 214. In some embodiments, the opening 224 is defined by an opening-defining wall 226, which is constituted by the surface 228 of the metal pad 218 and a side surface 230 defined by the first and second dielectric layers 220, 222. In some embodiments, after forming the opening 224, a wafer acceptance test (WAT) may be performed to determine if the combined feature 202 is functional based on a pre-determined WAT standard.

Figure 4:
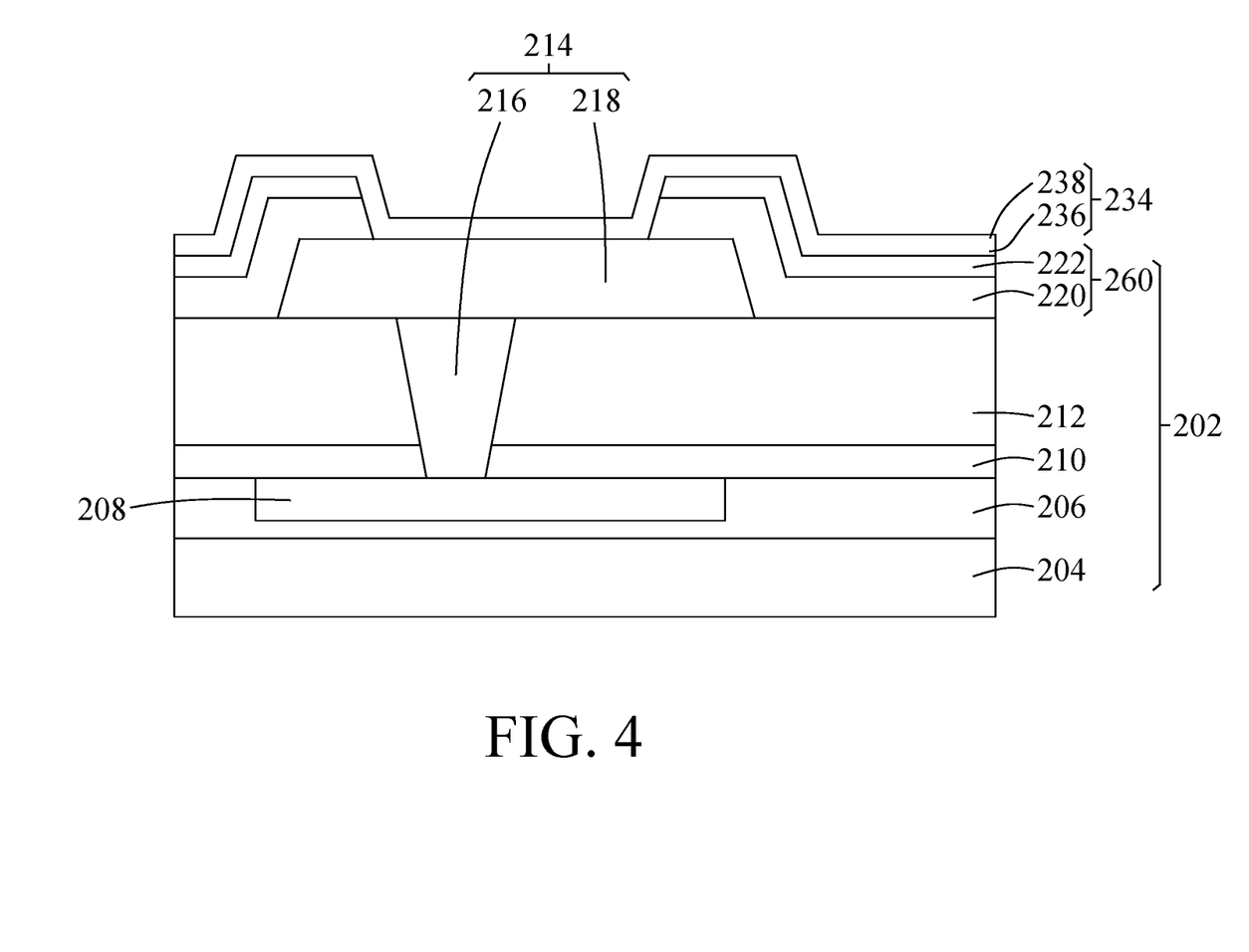

In accordance with some embodiments, as shown in FIG. 1, the method 100 then proceeds to block 106, where a protection layer is formed. In some embodiments, before forming the protection layer 234, a pre-clean treatment may be applied to the surface 228 of the metal pad 218 (see FIG. 3). In some embodiments, the pre-clean treatment may include a wet chemical treatment using ammonia or other suitable chemicals, a dry plasma treatment using oxygen, nitrogen, ammonia plasma, or a combination of wet chemical and dry plasma treatments. Referring to FIG. 4, after the pre-clean treatment, the protection layer 234 is formed on the combined feature 202. In some embodiments, the protection layer 234 covers a top surface 232 of the second dielectric layer 222 (see FIG. 3) and the opening-defining wall 226 (see FIG. 3) (i.e., the surface 228 of the metal pad 218 and the side surface 230). In some embodiments, the protection layer 234 is an oxide-and-nitride-based layer formed by CVD, atomic layer deposition (ALD), other suitable techniques, or any combination thereof. In some embodiments, the protection layer 234 may be a single layer which has a chemical composition of $SiO_xN_y$, where $0<x<2$ and $0<y<1.33$, but other ranges of values are also within the scope of this disclosure. In some embodiments, the protection layer 234 may be a single layer with nitrogen content ranging from about 1% to about 20%, but other ranges of values are also within the scope of this disclosure. In some embodiments, the nitride content (e.g., silicon-nitrogen bonding) in the protection layer 234 may prevent ambient moisture (e.g., hydroxyl group) from entering the combined feature 202 and from oxidizing the interconnecting structure 214. In some embodiments, the oxide content (e.g., silicon-oxygen bonding) in the protection layer 234 may prevent contaminants from entering the combined feature 202 and from contaminating the interconnecting structure 214. Such contaminants may be fluorine (e.g., fluoride) from a subsequently formed polymeric layer 240 (see FIG. 5). In some embodiments, the protection layer 234 may be an oxide layer doped with nitrogen by ion implantation (IMP), other suitable techniques or any combination thereof. In some embodiments, nitrogen may be evenly distributed in the oxide layer. In some embodiments, the protection layer 234 may have a bottom portion 236 adjacent to the surface 228 of the metal pad 218 (see FIG. 3) and the underlying second dielectric layer 222, and a top portion 238 away from the surface 228 of the metal pad 218 and the underlying second dielectric layer 222. In some embodiments, nitrogen concentration in the bottom portion 236 of the protection layer 234 may be higher than nitrogen concentration in the top portion 238 of the protection layer 234; and in other embodiments, nitrogen concentration in the bottom portion 236 of the protection layer 234 may be lower than nitrogen concentration in the top portion 238 of the protection layer 234. In some embodiments, the protection layer 234 may have a gradient nitrogen distribution, where the nitrogen concentration of the protection layer 234 increases toward the surface 228 of the metal pad 218 or decreases toward the surface 228 of the metal pad 218. In some embodiments, the protection layer 234 is substantially free from fluorine such that the interconnecting structure 214 is not contaminated with fluorine. In some embodiments, the protection layer 234 is substantially free from carbon such that the protection layer 234 can be more easily etched in subsequent processes. In some embodiments, the protection layer 234 may have a thickness not greater than about 100 Å. In some embodiments, the thickness of the protection layer 234 may range from about 50 Å to about 100 Å, from about 50 Å to about 60 Å, from about 60 Å to about 70 Å, from about 70 Å to about 80 Å, from about 80 Å to about 90 Å, from about 90 Å to about 100 Å, but other ranges of values are also within the scope of this disclosure. If the thickness of the protection layer 234 is too small, such as smaller than about 50 Å, the protection layer 234 may not be able to effectively protect the interconnecting structure 214 from moisture, fluorine and/or other contaminants. If the thickness of the protection layer 234 is too large, such as greater than about 100 Å, it may be difficult to etch away a portion of the protection layer 234 in subsequent processes.

Figure 5:
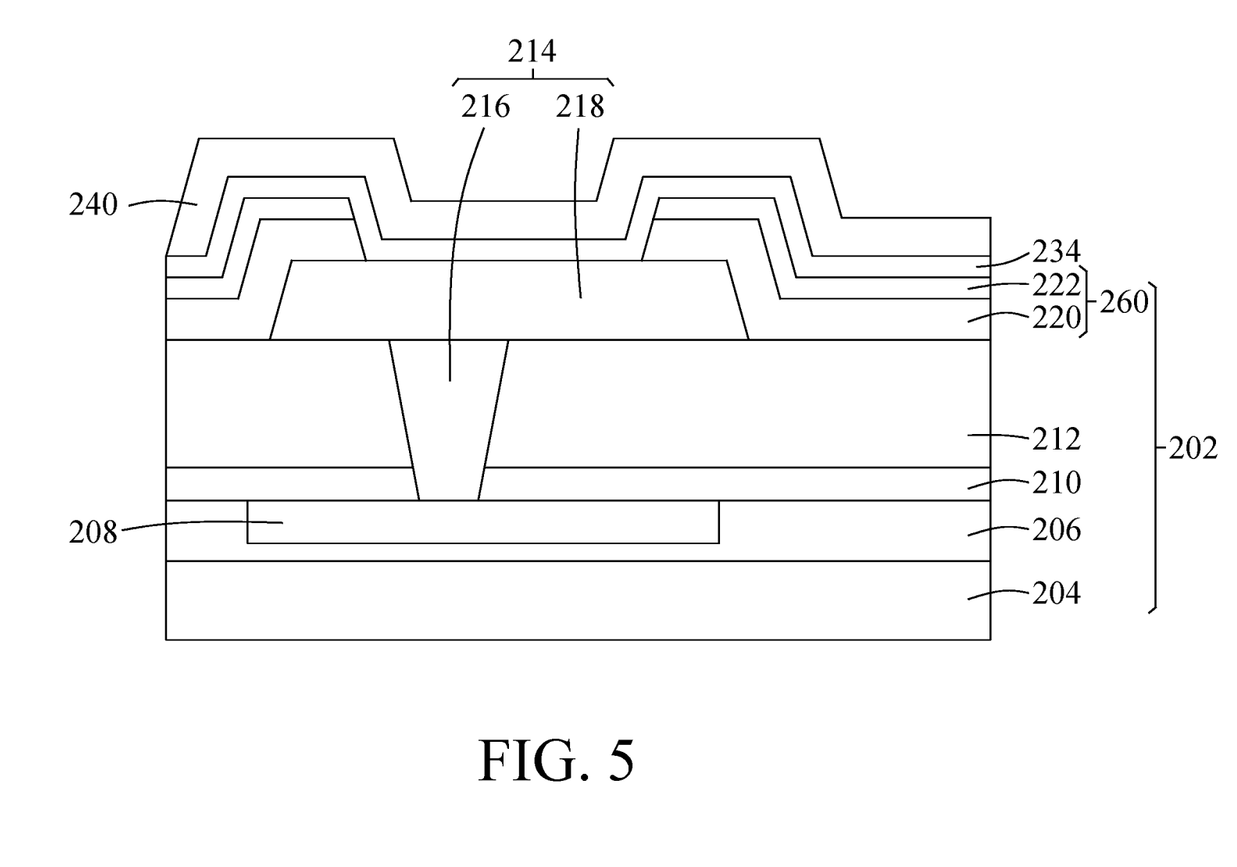

In accordance with some embodiments, as shown in FIG. 1, the method 100 then proceeds to block 108, where the polymeric layer is formed. Referring to FIG. 5, in some embodiments, the polymeric layer 240 is formed on and covers the protection layer 234 using spin coating, CVD, ALD, other suitable techniques, or any combination thereof. In some embodiments, the polymeric layer 240 may include fluorine and/or other suitable halogens for improving patterning resolution in a subsequent patterning process, such as a photolithography process. The protection layer 234 may effectively prevent the fluorine of the polymeric layer 240 from entering the combined feature 202 and contaminating the interconnecting structure 214. In some embodiments, the polymeric layer 240 may be made of polyimide (PI) and/or other suitable materials, and may be made of monomers, such as 2,2-bis(3,4-dicarboxyphenyl) hexafluoropropane dianhydride (6FDA), 2,2-bis[4-(4-aminophenoxy)phenyl] hexafluoropropane (BDAF), 1,4-bis(4-amino-2-trifluoromethyl-phenoxy) benzene (6FAPB), 4,4'-bis(4-amino-2-trifluoro-methylphenoxy) biphenyl (6FBPB), other fluorinated dianhydride, other fluorinated diamine, other fluorinated compounds, or any combination thereof. In some embodiments, the polymeric layer 240 may have a fluorine concentration not less than 40000 ppm, but other ranges of values are also within the scope of this disclosure. In some embodiments, the polymeric layer 240 has a thickness ranging from about 500 Å to about 2000 Å, but other ranges of values are also within the scope of this disclosure.

Figure 6:
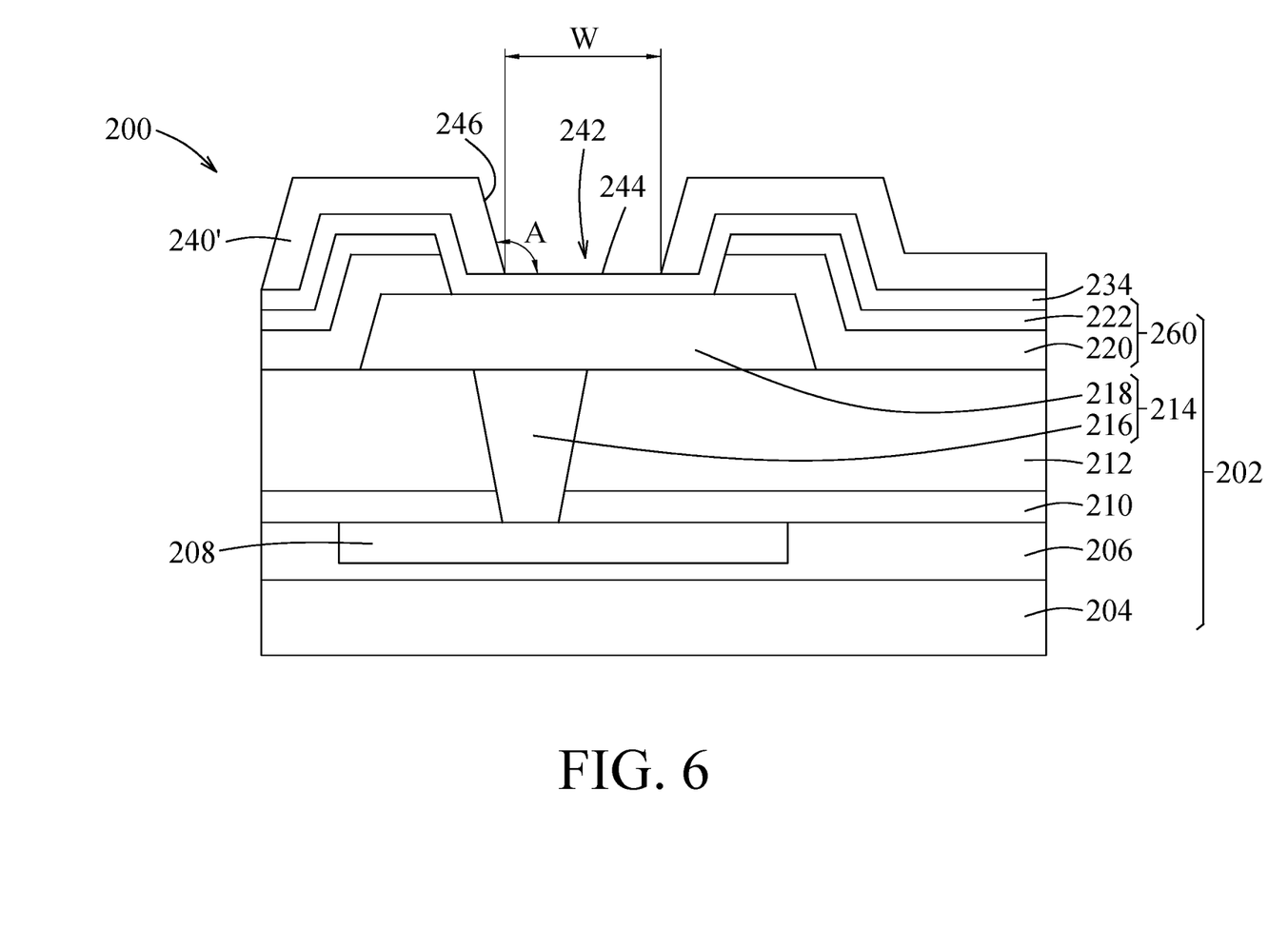

In accordance with some embodiments, as shown in FIG. 1, the method 100 then proceeds to block 110, where the polymeric layer is patterned. Referring to FIGS. 5 and 6, in some embodiments, the polymeric layer 240 (see FIG. 5) is exposed to a radiation light (e.g., ultraviolet (UV) light or other suitable radiation lights) through a pre-determined mask (not shown), followed by developing the polymeric layer 240 into a patterned polymeric layer 240' shown in FIG. 6. Then, the patterned polymeric layer 240' may be cured by annealing or other suitable technique, thereby obtaining the semiconductor structure 200. The annealing temperature may be not greater than about 350° C., but other ranges of values are also within the scope of this disclosure.

Referring to FIG. 6, in some embodiments, the semiconductor structure 200 includes the combined feature 202, the protection layer 234 disposed on the combined feature 202, and the patterned polymeric layer 240' disposed on the protection layer 234. The protection layer 234 covers the interconnecting structure 214 and the first and second dielectric layers 220, 222. The patterned polymeric layer 240' is formed with an opening 242 from which a surface 244 of the protection layer 234 is exposed. In some embodiments, the opening 242 of the patterned polymeric layer 240' has a width (W) not greater than about 20 μm, or not greater than about 10 μm, but other ranges of values are also within the scope of this disclosure. In other embodiments, the width (W) of the opening 242 of the patterned polymeric layer 240' may be not less than about 20 μm. In some embodiments, the opening 242 of the patterned polymeric layer 240' may be substantially circular when viewed from above, but other suitable shapes are also within the scope of this disclosure. In some embodiments, the opening 242 may be defined by a side wall 246 of the patterned polymeric layer 240'. An included angle (A) between the side wall 246 of the patterned polymeric layer 240' and the surface 244 of the protection layer 234 may range from about 90° to about 95°, but other ranges of values are also within the scope of this disclosure. If the included angle (A) between the side wall 246 of the patterned polymeric layer 240' and the surface 244 of the protection layer 234 is too small, such as less than about 90°, a subsequently formed bump feature 300 (see FIG. 8) may not completely fill the opening 242 of the patterned polymeric layer 240'. If the included angle (A) between the side wall 246 of the patterned polymeric layer 240' and the surface 244 of the protection layer 234 is too large, such as greater than about 95°, the subsequently formed bump feature 300 (see FIG. 8) may also not completely fill the opening 242 of the patterned polymeric layer 240' or may not properly adhere to the patterned polymeric layer 240'. In some embodiments, the protection layer 234 may protect the interconnecting structure 214 from contamination of fluorine for at least one month or at least a year.

Figure 7:
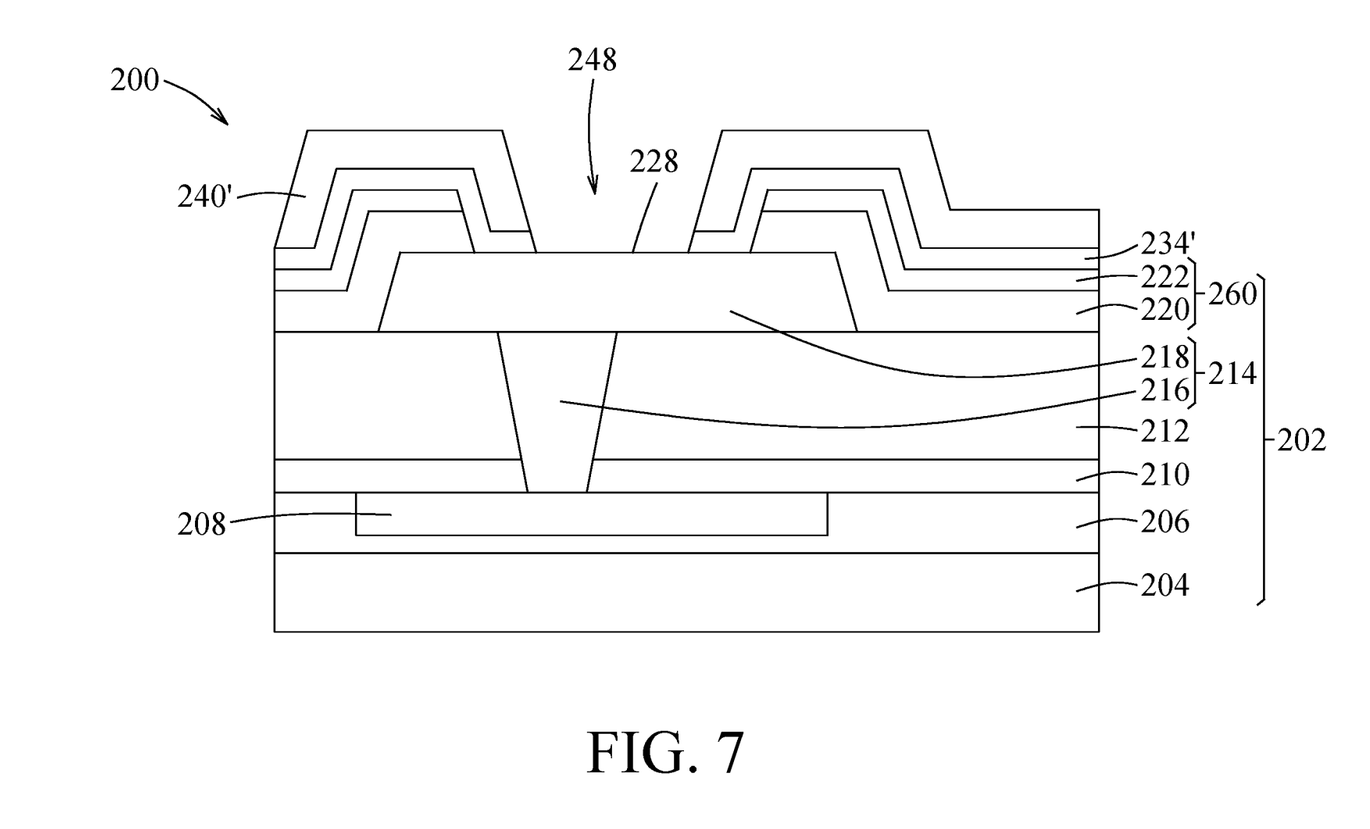
FIGS. 7 and 8 are schematic views showing intermediate stages of making an interconnecting feature on the semiconductor structure in accordance with some embodiments.

Referring to FIGS. 6 and 7, in some embodiments, a portion of the protection layer 234 may be removed by dry etching or other suitable techniques. Such process of etching the protection layer 234 is illustrated by block 112 of FIG. 1. In some embodiments, dry etching may use nitrogen plasma, oxygen plasma, other suitable etchants, or any combination thereof, to etch the protection layer 234 such that the surface 228 of the metal pad 218 is exposed from the etched protection layer 234' and the patterned polymeric layer 240'. Such a process of etching the protection layer 234 may be an $N_2/O_2$ ashing process. After etching the protection layer 234, the exposed surface 228 of the metal pad 218 may be cleaned by deionized (DI) water, isopropyl alcohol (IPA), other suitable chemicals, or any combination thereof, to remove residue on the exposed surface 228 of the metal pad 218 and to clean the exposed surface 228. Such a cleaning process may be known as a scrubbing process. In some embodiments, the etched protection layer 234' and the patterned polymeric layer 240' cooperatively define an opening 248 from which the surface 228 of the metal pad 218 is exposed. Referring to FIGS. 5 and 7, in some embodiments, the protection layer 234 and the polymeric layer 240 may be etched at the same time using dry etching or other suitable techniques, to form the opening 248 shown in FIG. 7. In some embodiments, various measurement tools may be used to measure the semiconductor structure 200. For example, in FIG. 7, energy-dispersive spectroscopy (EDS) may be used to scan the top surface of the semiconductor structure 200 to determine if the surface 228 of the metal pad 218 of the interconnecting structure 214 is contaminated by, for example, fluorine.

Figure 8:
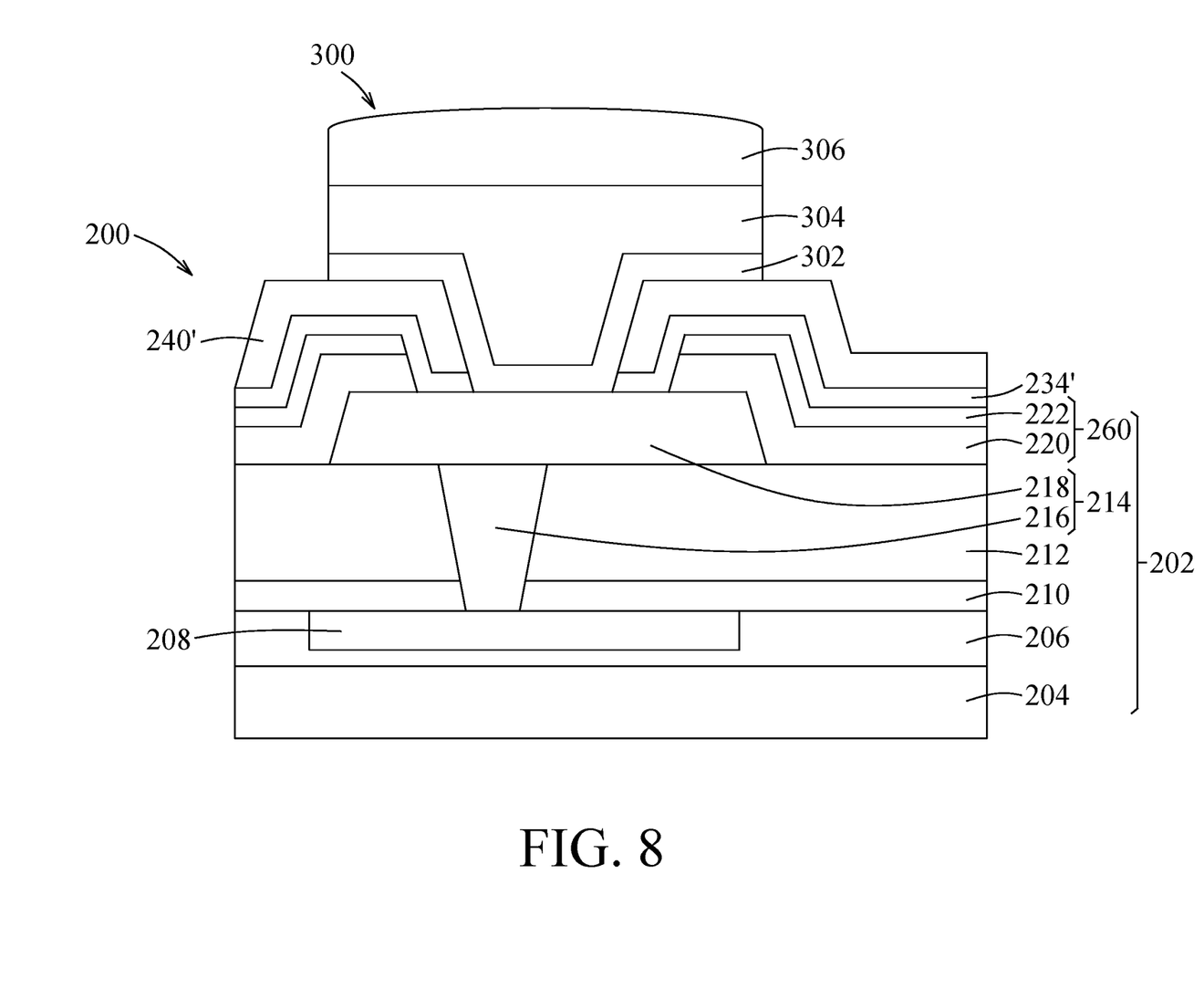

Referring to FIG. 8, in some embodiments, the bump feature 300 may be formed on the patterned polymeric layer 240', may fill the opening 248 (see FIG. 7), and may be electrically connected to the metal pad 218 of the interconnecting structure 214. In some embodiments, the bump feature 300 may serve to electrically connect the interconnecting structure 214 to bonding pads of a semiconductor die (not shown), a redistribution structure (not shown), a package structure (not shown), a printed circuit board (not shown) or other suitable devices. In other embodiments, the bump feature 300 may be replaced with a redistribution structure (not shown), such as a redistribution layer (RDL) or other suitable electrical interconnection structures. In some embodiments, the bump feature 300 includes an under-bump-metallization (UBM) layer 302 (may also be known as under-bump-metallurgy (UBM) layer) disposed on the metal pad 218 of the interconnecting structure 214 and the patterned polymeric layer 240', and is electrically connected to the metal pad 218 of the interconnecting structure 214. In some embodiments, the bump feature 300 further includes a bump layer 304 that is disposed on and electrically connected to the UBM layer 302. In some embodiments, the bump feature 300 further includes a solder layer 306 that is disposed on and electrically connected to the bump layer 304. In some embodiments, each of the UBM layer 302 and the bump layer 304 may be formed by electroplating, electroless plating, other suitable techniques, or any combination thereof. In some embodiments, each of the UBM layer 302 and the bump layer 304 may include Ta, Ti, Ni, Co, Cu, other suitable materials, or any combination thereof. In some embodiments, the bump layer 304 may include Cu content greater than that of the UBM layer 302, and may thus be referred to as a copper pillar. In some embodiments, the solder layer 306 may include Cu, Sn, Ag, Zn, Sb, Bi, Pb, Au, In, other suitable materials, or any combination thereof.

Figure 9:
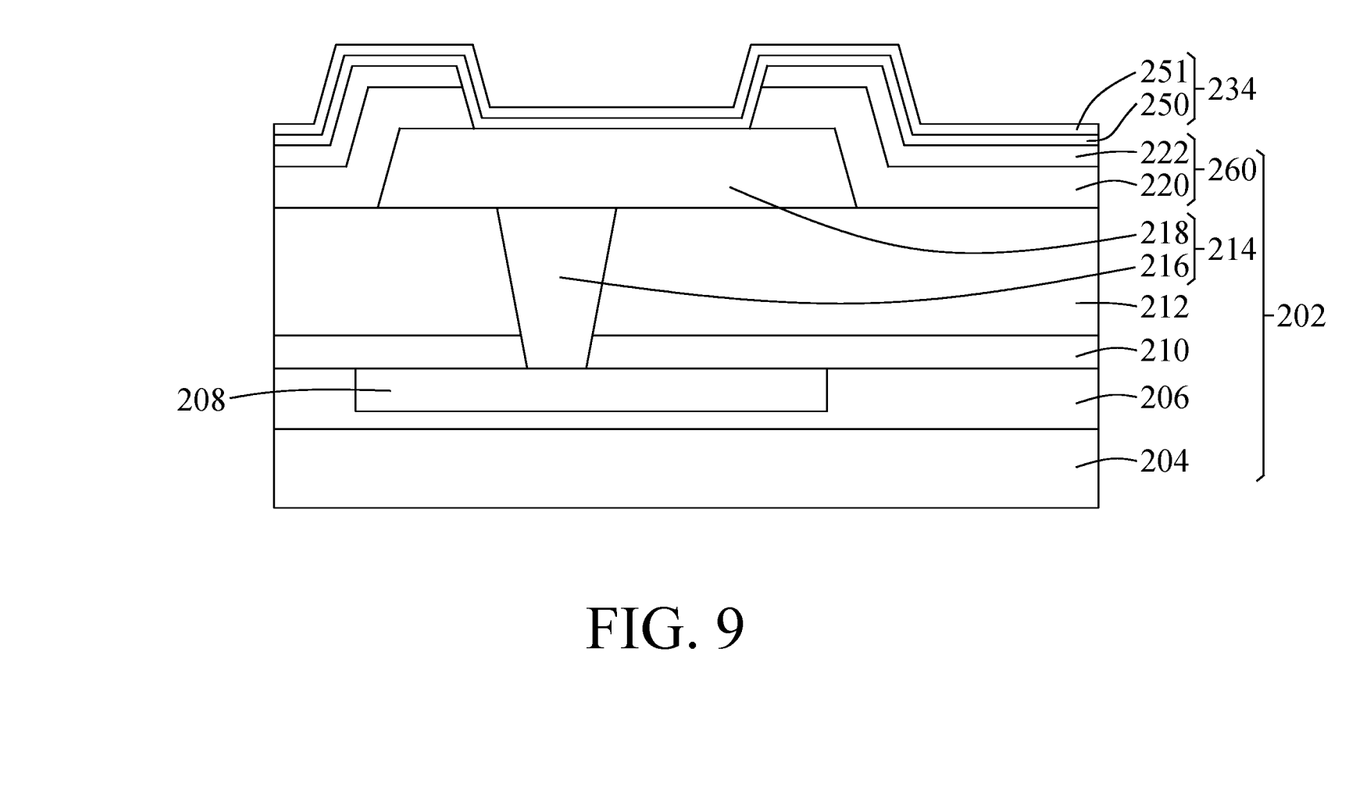
FIGS. 9 to 11 are schematic views showing intermediate stages of making semiconductor structure and the interconnecting feature in accordance with some embodiments.

Referring to FIGS. 1 and 9, in some embodiments, the process of forming the protection layer 234 (i.e., the oxide-and-nitride-based layer) as illustrated by block 106 in FIG. 1 involves forming a first sub-layer 250 on the combined feature 202 to cover the first and second dielectric layers 220, 222, and the surface 228 of the metal pad 218 (see FIG. 3). Then, a second sub-layer 251 is formed on and covers the first sub-layer 250. The first and second sub-layers 250, 251 together constitute the protection layer 234. In some embodiments, the first sub-layer 250 includes silicon nitride (referred to as a silicon-nitride-based layer) and the second sub-layer 251 includes silicon oxide (referred to as a silicon-oxide-based layer); and in other embodiments, the first sub-layer 250 may be the silicon-oxide-based layer and the second sub-layer 251 may be the silicon-nitride-based layer. In some embodiments, silicon oxide in the protection layer 234 has a chemical composition of $SiO_x$, where $0<X<2$. In some embodiments, silicon nitride in the protection layer 234 has a chemical composition of $SiN_y$, where $0<y<1.33$. In some embodiments, the nitride content (e.g., silicon-nitrogen bonding) in silicon-nitride-based layer of the protection layer 234 may prevent ambient moisture (e.g., hydroxyl group) from entering the combined feature 202 and from oxidizing the interconnecting structure 214. In some embodiments, the oxide content (e.g., silicon-oxygen bonding) in the silicon-oxide-based layer of the protection layer 234 may prevent contaminants from entering the combined feature 202 and from contaminating the interconnecting structure 214. Such contaminants may be fluorine (e.g., fluoride) from the subsequently formed polymeric layer 240 (see FIG. 10). In some embodiments, the silicon-nitride-based layer of the protection layer 234 may be formed to have a suitable density which is low enough such that the protection layer 234 may be easily etched in the process illustrated by block 112 of FIG. 1. In some embodiments, the silicon-nitride-based layer may be formed using a low temperature deposition process, such as CVD, ALD, other suitable techniques or any combination thereof, at a suitable temperature, such as a temperature not greater than about 300° C. For a deposition temperature greater than about 300° C., the deposited silicon-nitride-based layer may be too dense and may not be easily etched in the process illustrated by block 112 of FIG. 1. In some embodiments, the silicon-nitride-based layer may have a density ranging from about 2.4 $g/cm^3$ to about 2.8 $g/cm^3$, about 2.4 $g/cm^3$ to about 2.5 $g/cm^3$, about 2.5 $g/cm^3$ to about 2.6 $g/cm^3$, about 2.6 $g/cm^3$ to about 2.7 $g/cm^3$, about 2.7 $g/cm^3$ to about 2.8 $g/cm^3$, and other ranges of values are also within the scope of this disclosure. If the silicon-nitride-based layer is too dense (e.g., having a density greater than about 2.8 $g/cm^3$), it may be difficult to etch the silicon-nitride-based layer in the process illustrated by block 112 of FIG. 1. If the silicon-nitride-based layer is not dense enough (e.g., having a density less than about 2.4 $g/cm^3$), the silicon-nitride-based layer may not effectively block the ambient moisture. In some embodiments, the silicon-oxide-based layer may have a density ranging from about 2.2 $g/cm^3$ to about 2.5 $g/cm^3$, about 2.2 $g/cm^3$ to about 2.3 $g/cm^3$, about 2.3 $g/cm^3$ to about 2.4 $g/cm^3$, about 2.4 $g/cm^3$ to about 2.5 $g/cm^3$, and other ranges of values are also within the scope of this disclosure. If the silicon-oxide-based layer is too dense (e.g., having a density greater than about 2.5 $g/cm^3$), it may be difficult to etch the silicon-oxide-based layer in the process illustrated by block 112 of FIG. 1. However, if the silicon-oxide-based layer is not dense enough (e.g., having a density less than about 2.2 $g/cm^3$), the silicon-nitride-based layer may not effectively block the contaminants (e.g., fluorine). In some embodiments, the silicon-nitride-based layer has a thickness ranging from about 20 Å to about 30 Å, about 20 Å to about 25 Å, about 25 Å to about 30 Å, and other ranges of values are also within the scope of this disclosure. If the silicon-nitride-based layer is too thick (e.g., thicker than about 30 Å), it may be difficult to etch the silicon-nitride-based layer in the process illustrated by block 112 of FIG. 1. If the silicon-nitride-based layer is too thin (e.g., thinner than about 20 Å), the silicon-nitride-based layer may not effectively block the ambient moisture. In some embodiments, the silicon-oxide-based layer has a thickness ranging from about 50 Å to about 100 Å, about 50 Å to about 60 Å, about 60 Å to about A, about 70 Å to about 80 Å, about 80 Å to about 90 Å, about 90 Å to about 100 Å, and other ranges of values are also within the scope of this disclosure. If the silicon-oxide-based layer is too thick (e.g., thicker than about 100 Å), it may be difficult to etch the silicon-oxide-based layer in the process illustrated by block 112 of FIG. 1. However, if the silicon-oxide-based layer is too thin (e.g., thinner than about 50 Å), the silicon-oxide-based layer may not effectively block the contaminants (e.g., fluorine).

Figure 10:
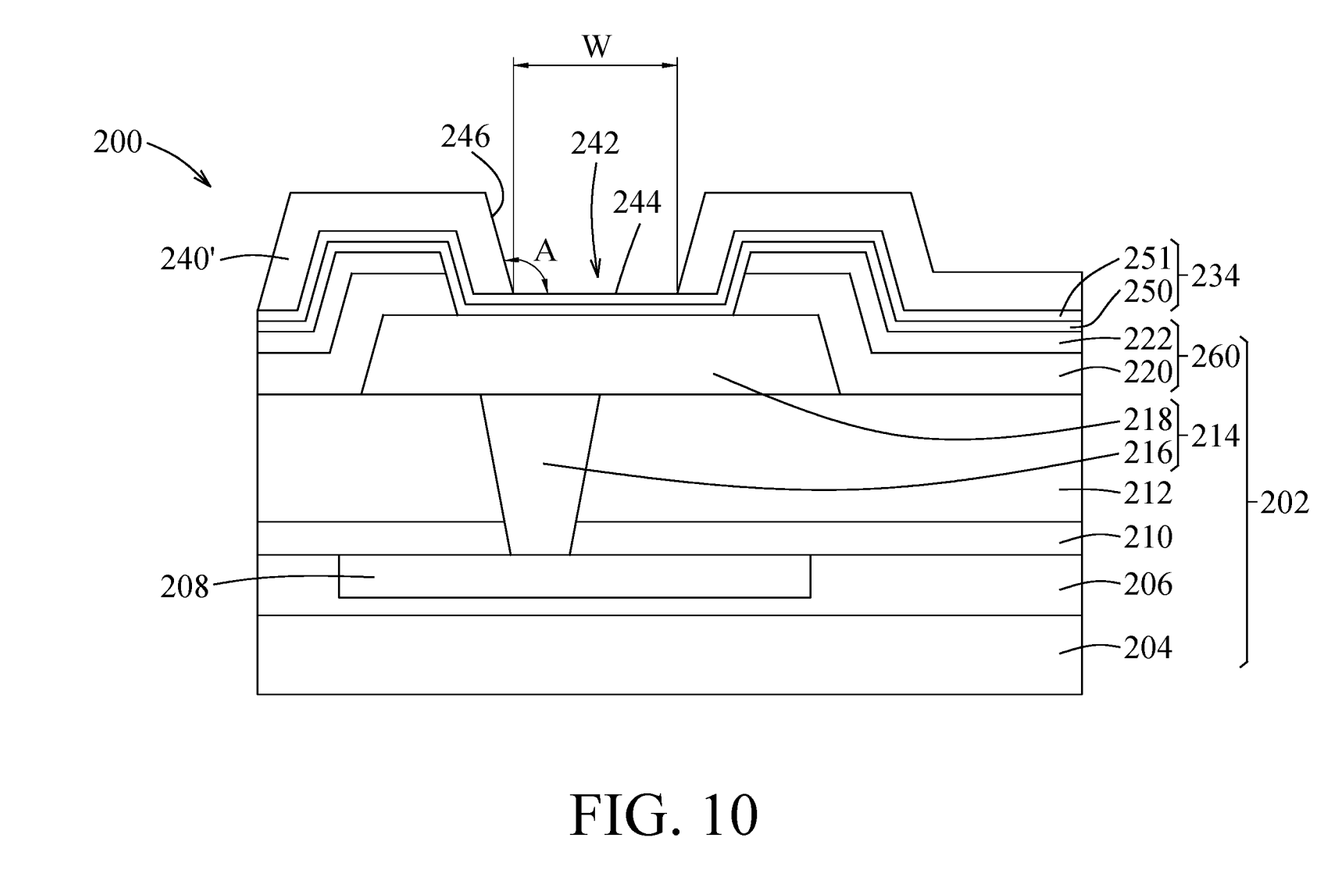

In accordance with some embodiments, after the process illustrated by block 106 of FIG. 1 and FIG. 9, the processes illustrated by blocks 108 and 110 of FIG. 1 may be carried out, with variations if necessary, thereby obtaining the semiconductor structure 200 shown in FIG. 10. In some embodiments, the semiconductor structure 200 includes the combined feature 202, the protection layer 234 disposed on the combined feature 202, and the patterned polymeric layer 240' disposed on the protection layer 234. The first sub-layer 250 of the protection layer 234 may cover the first and second dielectric layers 220, 222, and the surface 228 of the metal pad 218 (see FIG. 3). The second sub-layer 251 of the protection layer 234 may cover the first sub-layer 250. The patterned polymeric layer 240' is disposed on the protection layer 234, and the width (W) of the opening 242 of the patterned polymeric layer 240' may be not greater than about 20 μm, or not greater than about 10 μm, but other ranges of values are also within the scope of this disclosure. In other embodiments, the width (W) of the opening 242 of the patterned polymeric layer 240' may be not less than about 20 μm. In some embodiments, the opening 242 of the patterned polymeric layer 240' may be substantially circular when viewed from above, but other suitable shapes are also within the scope of this disclosure. In some embodiments, the included angle (A) between the side wall 246 of the patterned polymeric layer 240' and the surface 244 of the protection layer 234 may range from 90° to about 95°, but other ranges of values are also within the scope of this disclosure. In some embodiments, the protection layer 234 may protect the interconnecting structure 214 from contamination by fluorine for at least one month or at least a year.

Figure 11:
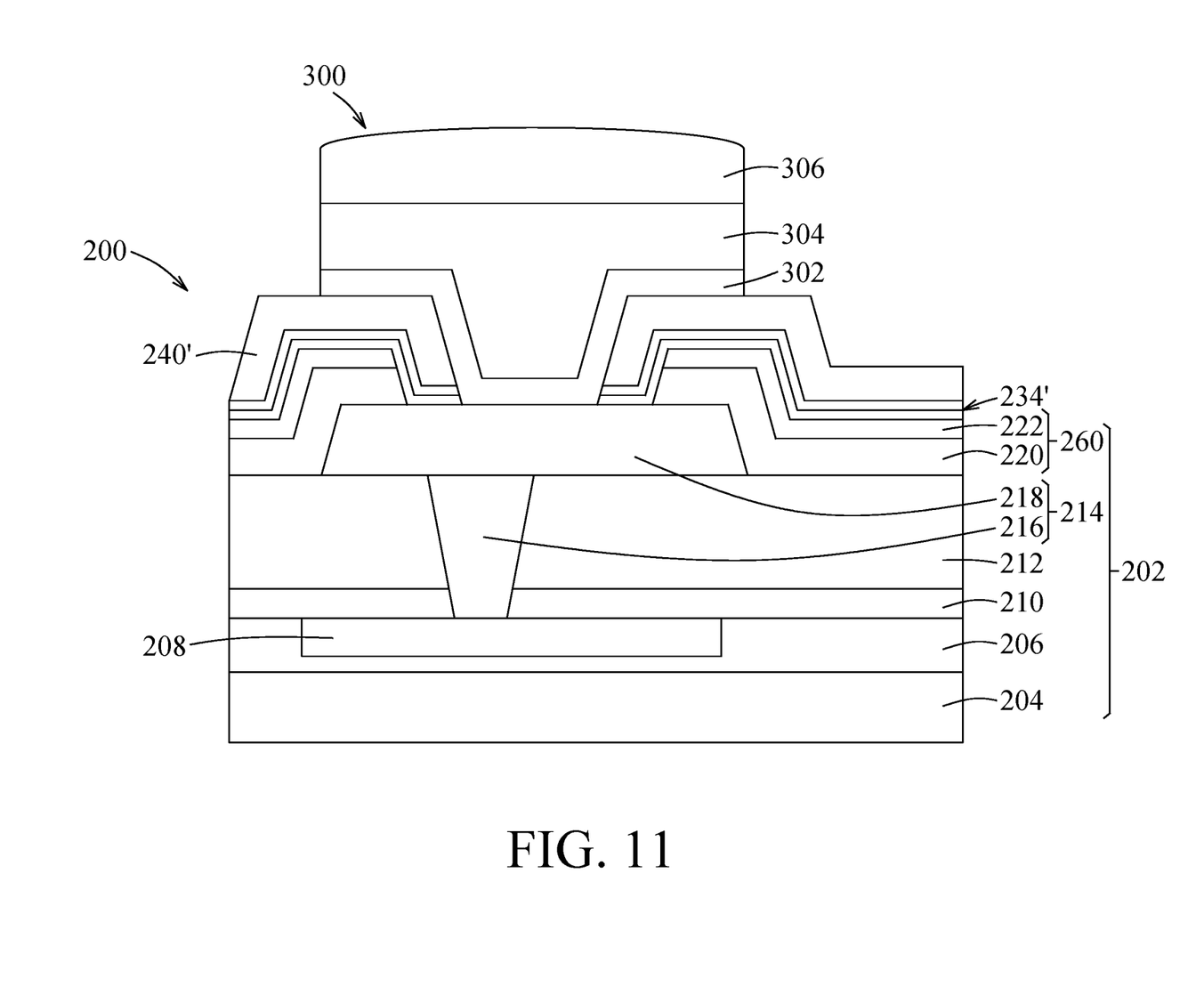

In accordance with some embodiments, after the process illustrated by block 110 in FIG. 1, blocks 112 and 114 may be carried out to obtain the structure shown in FIG. 11, where the bump feature 300 is formed and electrically connected to the interconnecting structure 214. In some embodiments, the polymeric layer 240 (see FIG. 5) and the protection layer 234 shown in FIG. 10 may be etched together.

Since halogens (e.g., fluorine) may be introduced into the polymeric layer (PI layer) for improving patterning resolution, the interconnecting structure 214 may be contaminated by fluorine. For example, the fluorine may react with ambient moisture to form hydrofluoric acid, which may erode the interconnecting structure 214. In addition, fluorine might react with the interconnecting structure 214, which not only increases electrical resistivity of the interconnecting structure 214, but also deteriorate bonding strength between the interconnecting structure 214 and the subsequently formed bump feature 300. The protection layer 234 (i.e., the oxide-and-nitride-based layer) of this disclosure can block fluorine as well as ambient moisture, thereby protecting the interconnecting structure 214.

In accordance with some embodiments of the present disclosure, a semiconductor includes a combined feature, a protection layer and a polymeric layer. The combined feature includes a passivation layer, an interconnecting structure disposed on the passivation layer, and a dielectric layer disposed on the passivation layer and the interconnecting structure. The protection layer is disposed on the dielectric layer, and is oxide-and-nitride based. The polymeric layer is disposed on the protection layer and is separated from the interconnecting structure by the protection layer.

In accordance with some embodiments of the present disclosure, the protection layer has a chemical composition of $SiO_xN_y$, where $0<x<2$ and $0<y<1.33$.

In accordance with some embodiments of the present disclosure, the protection layer has a thickness ranging from about 50 Å to about 100 Å.

In accordance with some embodiments of the present disclosure, the protection layer includes an oxide layer with nitrogen evenly distributed therein.

In accordance with some embodiments of the present disclosure, the protection layer includes an oxide layer with nitrogen concentration increasing toward or away from the interconnecting structure.

In accordance with some embodiments of the present disclosure, the protection layer includes a bottom portion and a top portion, nitrogen concentration in one of the bottom portion and the top portion being higher than the nitrogen concentration in the other one of the bottom portion and the top portion.

In accordance with some embodiments of the present disclosure, the protection layer includes a first sub-layer that is disposed on the combined feature, and a second sub-layer that is disposed on the first sub-layer, one of the first and second sub-layers is a silicon-oxide-based layer, and the other one of the first and second sub-layers is a silicon-nitride-based layer.

In accordance with some embodiments of the present disclosure, silicon oxide in the silicon-oxide-based layer has a chemical composition of $SiO_x$, where $0<x<2$, and silicon nitride in the silicon-nitride-based layer has a chemical composition of $SiN_y$, where $0<y<1.33$.

In accordance with some embodiments of the present disclosure, the silicon-nitride-based layer has a density ranging from about 2.4 g/cm³ to about 2.8 g/cm³.

In accordance with some embodiments of the present disclosure, the silicon-oxide-based layer has a density ranging from about 2.2 g/cm³ to about 2.5 g/cm³.

In accordance with some embodiments of the present disclosure, the silicon-nitride-based layer has a thickness ranging from about 20 Å to about 30 Å.

In accordance with some embodiments of the present disclosure, the silicon-oxide-based layer has a thickness ranging from about 50 Å to about 100 Å.

In accordance with some embodiments of the present disclosure, the interconnecting structure has a surface outside of the dielectric layer, the protection layer covers the dielectric layer and the surface of the interconnecting structure, and the polymeric layer is formed with an opening that exposes a portion of the protection layer disposed on the interconnecting structure.

In accordance with some embodiments of the present disclosure, a semiconductor structure includes a combined feature, a bump feature, a protection layer and a fluorine-containing polymeric layer. The combined feature includes a passivation layer, a contact via extending through the passivation layer, a conductive pad disposed on and electrically connected to the contact via, and a dielectric layer disposed on the passivation layer and the conductive pad. The bump feature is disposed on the combined feature and is electrically connected to the conductive pad. The protection layer is disposed on the dielectric layer and surrounds a lower portion of the bump feature. The protection layer is an oxide-and-nitride based layer. The fluorine-containing polymeric layer is disposed on the protection layer, surrounds the lower portion of the bump feature, and is separated from the conductive pad by the protection layer.

In accordance with some embodiments of the present disclosure, the protection layer includes an oxide layer with nitrogen distributed therein.

In accordance with some embodiments of the present disclosure, the protection layer includes a first sub-layer that is disposed on the combined feature, and a second sub-layer that is disposed on the first sub-layer. One of the first and second sub-layers is a silicon-oxide-based layer, and the other one of the first and second sub-layers is a silicon-nitride-based layer.

In accordance with some embodiments of the present disclosure, a method of making a semiconductor structure includes: forming a combined feature that includes a passivation layer, an interconnecting structure disposed on the passivation layer, a dielectric layer disposed on the passivation layer and covering the interconnecting structure; removing a portion of the dielectric layer to expose a surface of the interconnecting structure; forming a protection layer covering the dielectric layer and the surface of the interconnecting structure, the protection layer being an oxide-and-nitride based layer; forming a polymeric layer covering the protection layer; and removing a portion of the polymeric layer to expose a surface of the protection layer disposed on the interconnecting structure.

In accordance with some embodiments of the present disclosure, in the step of forming the protection layer of the method, an oxide layer is formed, followed by doping the oxide layer with nitrogen such that nitrogen is evenly distributed therein.

In accordance with some embodiments of the present disclosure, in the step of forming the protection layer, an oxide layer is formed, followed by doping the oxide layer with nitrogen such that nitrogen concentration in the oxide layer increases toward or away from the interconnecting structure.

In accordance with some embodiments of the present disclosure, in the step of forming the protection layer, a first sub-layer is formed, followed by forming a second sub-layer on the first sub-layer. One of the first and second sub-layers is a silicon-oxide-based layer, and the other one of the first and second sub-layers is a silicon-nitride-based layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a combined feature including a passivation layer, a contact via extending through the passivation layer, a conductive pad disposed on and connected to the contact via, and a dielectric layer disposed on the passivation layer and the conductive pad;
   a bump feature disposed on the combined feature and connected to the conductive pad;
   a protection layer disposed on the dielectric layer and surrounding a lower portion of the bump feature; and
   a fluorine-containing polymeric layer disposed on the protection layer, surrounding at least a part of the lower portion of the bump feature, and separated from the conductive pad by the protection layer,
   wherein the protection layer includes a first sub-layer that is in direct contact with the conductive pad, and a second sub-layer that is in direct contact with the fluorine-containing polymeric layer, one of the first sub-layer and the second sub-layer being made of an oxide material, the other one of the first sub-layer and the second sub-layer being made of a nitride material.

2. The semiconductor structure as claimed in claim 1, wherein the first sub-layer is disposed on the combined feature, the second sub-layer is disposed on the first sub-layer, one of the first and second sub-layers is a silicon-oxide-based layer, and the other one of the first and second sub-layers is a silicon-nitride-based layer.

3. The semiconductor structure as claimed in claim 1, wherein the passivation layer includes undoped silica glass.

4. The semiconductor structure as claimed in claim 1, wherein the fluorine-containing polymeric layer has a fluorine concentration not less than 40000 ppm.

5. A semiconductor structure, comprising:
   a combined feature including
      a passivation layer,
      an interconnecting structure including a conductive pad disposed on the passivation layer, and
      a dielectric layer disposed to cover a part of the passivation layer exposed from the conductive pad and a first portion of the conductive pad such that a second portion of the conductive pad is exposed from the dielectric layer;
   a protection layer disposed to cover the dielectric layer and a first part of the second portion of the conductive pad such that a second part of the second portion of the conductive pad is exposed from the protection layer;
   a polymeric layer disposed on the protection layer and separated from the first part of the second portion of the conductive pad by the protection layer; and
   a bump feature formed to extend through the polymeric layer and the protection layer to be connected to the second part of the second portion of the conductive pad,
   wherein the protection layer includes a first sub-layer that is in direct contact with the conductive pad, and a second sub-layer that is in direct contact with the polymeric layer, one of the first sub-layer and the second sub-layer being made of an oxide material, the other one of the first sub-layer and the second sub-layer being made of a nitride material.

6. The semiconductor structure as claimed in claim 5, wherein the protection layer is both carbon-free and fluorine free.

7. The semiconductor structure as claimed in claim 5, wherein the dielectric layer includes a first dielectric layer which is made of an oxide-based material, and a second dielectric layer which is made of a nitride-based material and which is disposed on the first dielectric layer, the second dielectric layer being separated from the passivation layer and the conductive pad by the first dielectric layer.

8. The semiconductor structure as claimed in claim 5, wherein the polymeric layer has a fluorine concentration not less than 40000 ppm.

9. The semiconductor structure as claimed in claim 5, wherein the one of the first sub-layer and the second sub-layer, which is made of the oxide material, has a thickness ranging from 50 Å to 100 Å, and the other one of the first sub-layer and the second sub-layer, which is made of the nitride material, has a thickness ranging from 20 Å to 30 Å.

10. The semiconductor structure as claimed in claim 5, wherein the passivation layer includes undoped silica glass.

11. A semiconductor structure, comprising:
    a combined feature including
       a passivation layer,
       an interconnecting structure including a conductive pad disposed on the passivation layer, and
       a dielectric layer disposed to cover a part of the passivation layer exposed from the conductive pad and a first portion of the conductive pad such that a second portion of the conductive pad is exposed from the dielectric layer;
    a protection layer disposed to cover the dielectric layer and a first part of the second portion of the conductive pad such that a second part of the second portion of the conductive pad is exposed from the protection layer;
    a polymeric layer disposed on the protection layer and separated from the first part of the second portion of the conductive pad by the protection layer; and
    a bump feature formed to extend through the polymeric layer and the protection layer to be connected to the second part of the second portion of the conductive pad,
    wherein the protection layer includes a first sub-layer that is in direct contact with the conductive pad, and a second sub-layer that is in direct contact with the polymeric layer, one of the first sub-layer and the second sub-layer being made of an oxide material, the other one of the first sub-layer and the second sub-layer being made of a nitride material, and wherein the polymeric layer is made of polyimide.

12. The semiconductor structure as claimed in claim 11, wherein the oxide material has a chemical composition of $SiO_x$, where $0<x<2$.

13. The semiconductor structure as claimed in claim 12, wherein the oxide material has a density ranging from 2.2 g/cm$^3$ to 2.5 g/cm$^3$.

14. The semiconductor structure as claimed in claim 11, wherein the oxide material has a thickness ranging from 50 Å to 100 Å.

15. The semiconductor structure as claimed in claim 11, wherein the nitride material has a chemical composition of $SiN_y$, where $0<y<1.33$.

16. The semiconductor structure as claimed in claim 15, wherein the nitride material has a density ranging from 2.4 g/cm$^3$ to 2.8 g/cm$^3$.

17. The semiconductor structure as claimed in claim 11, wherein the nitride material has a thickness ranging from 20 Å to 30 Å.

18. The semiconductor structure as claimed in claim 11, wherein the polymeric layer has a fluorine concentration not less than 40000 ppm.

19. The semiconductor structure as claimed in claim 11, wherein the polymeric layer has a thickness ranging from 500 Å to 2000 Å.

20. The semiconductor structure as claimed in claim 11, wherein the passivation layer includes undoped silica glass.

* * * * *